US009581512B2

(12) United States Patent
Lin et al.

(10) Patent No.: US 9,581,512 B2
(45) Date of Patent: Feb. 28, 2017

(54) PRESSURE SENSOR WITH DEFORMABLE MEMBRANE AND METHOD OF MANUFACTURE

(71) Applicant: InvenSense, Inc., San Jose, CA (US)

(72) Inventors: Chung-Hsien Lin, Hsinchu (TW); Rene Hummel, Baar (CH); Ulrich Bartsch, Meilen (CH); Marion Hermersdorf, Rodermark (DE); Tsung Lin Tang, Kaohsiung (TW); Wang Shen Su, Tainan (TW); Chia Min Lin, Hsinchu County (TW)

(73) Assignee: INVENSENSE, INC., Sunnyvale, CA (US)

( * ) Notice: Subject to any disclaimer, the term of this patent is extended or adjusted under 35 U.S.C. 154(b) by 5 days.

(21) Appl. No.: 14/522,014

(22) Filed: Oct. 23, 2014

(65) Prior Publication Data

US 2015/0122042 A1    May 7, 2015

(30) Foreign Application Priority Data

Nov. 6, 2013   (EP) .................................. 13005236

(51) Int. Cl.
 *G01L 9/00*   (2006.01)
 *G01L 19/00*  (2006.01)
 (Continued)

(52) U.S. Cl.
 CPC ............ *G01L 9/0073* (2013.01); *B23P 19/04* (2013.01); *B81B 7/0054* (2013.01); *G01L 9/12* (2013.01);
 (Continued)

(58) Field of Classification Search
 None
 See application file for complete search history.

(56) References Cited

U.S. PATENT DOCUMENTS 6,074,890 A    6/2000  Yao et al.
6,208,019 B1   3/2001  Tane et al.
   (Continued)

FOREIGN PATENT DOCUMENTS

EP    1860417    11/2007
EP    2075221    7/2009
   (Continued)

OTHER PUBLICATIONS

Office Action for European application No. 13005235.0 dated May 31, 2016.

*Primary Examiner* — Andre Allen
(74) *Attorney, Agent, or Firm* — Duane Morris LLP; Amir Tabarrok

(57) ABSTRACT

A pressure sensor comprises a first substrate and a cap attached to the first substrate. The cap includes a processing circuit, a cavity and a deformable membrane separating the cavity and a port open to an outside of the pressure sensor. Sensing means are provided for converting a response of the deformable membrane to pressure at the port into a signal capable of being processed by the processing circuit. The cap is attached to the first substrate such that the deformable membrane faces the first substrate and such that a gap is provided between the deformable membrane and the first substrate which gap contributes to the port. The first substrate comprises a support portion the cap is attached to, a contact portion for electrically connecting the pressure sensor to an external device, and one or more suspension elements for suspending the support portion from the contact portion.

17 Claims, 7 Drawing Sheets

(51) Int. Cl.
    *B23P 19/04*       (2006.01)
    *G01L 9/12*        (2006.01)
    *G01L 19/14*      (2006.01)
    *B81B 7/00*        (2006.01)

(52) U.S. Cl.
    CPC ........ *G01L 19/0084* (2013.01); *G01L 19/146* (2013.01); *B81B 2201/0264* (2013.01); *B81B 2207/012* (2013.01); *B81B 2207/095* (2013.01); *B81C 2203/0792* (2013.01); *Y10T 29/49165* (2015.01); *Y10T 29/49904* (2015.01)

(56) References Cited

U.S. PATENT DOCUMENTS

| | | | |
|---|---|---|---|
| 6,552,404 B1 * | 4/2003 | Hynes | G01L 9/0073 |
| | | | 257/415 |
| 7,704,774 B2 | 4/2010 | Mayer et al. | |
| 8,008,738 B2 * | 8/2011 | Villa | G01L 9/0045 |
| | | | 257/415 |
| 8,049,287 B2 * | 11/2011 | Combi | B81B 7/0061 |
| | | | 257/416 |
| 9,330,929 B1 * | 5/2016 | Kautzsch | H01L 21/3065 |
| 2002/0048839 A1 | 4/2002 | Miller et al. | |
| 2007/0019101 A1 | 1/2007 | Minamio et al. | |
| 2008/0061412 A1 | 3/2008 | Shen et al. | |
| 2008/0236292 A1 | 10/2008 | Reijs | |
| 2008/0251705 A1 | 10/2008 | Tseng | |
| 2009/0166827 A1 | 7/2009 | Foster et al. | |
| 2009/0322929 A1 | 12/2009 | Webster | |
| 2010/0109140 A1 | 5/2010 | Oh et al. | |
| 2010/0139409 A1 * | 6/2010 | Mitschke | G01L 27/007 |
| | | | 73/716 |
| 2010/0207217 A1 | 8/2010 | Zuniga-Ortiz et al. | |
| 2012/0037953 A1 | 2/2012 | Hayano | |
| 2013/0093030 A1 | 4/2013 | Isebrand et al. | |
| 2013/0127000 A1 | 5/2013 | Oganesian | |
| 2013/0181314 A1 | 7/2013 | Ryu et al. | |
| 2015/0040675 A1 * | 2/2015 | Ding | G01L 19/04 |
| | | | 73/754 |
| 2015/0048461 A1 | 2/2015 | Mayer | |
| 2015/0122038 A1 * | 5/2015 | Mayer | G01L 19/146 |
| | | | 73/715 |
| 2015/0122041 A1 * | 5/2015 | Lin | B23P 19/04 |
| | | | 73/724 |
| 2015/0260593 A1 * | 9/2015 | Hsu | B81C 1/00309 |
| | | | 73/754 |
| 2015/0268115 A1 * | 9/2015 | Robert | B81B 3/0021 |
| | | | 73/718 |

FOREIGN PATENT DOCUMENTS

| | | |
|---|---|---|
| EP | 2246292 | 11/2010 |
| EP | 2653443 | 10/2013 |

* cited by examiner

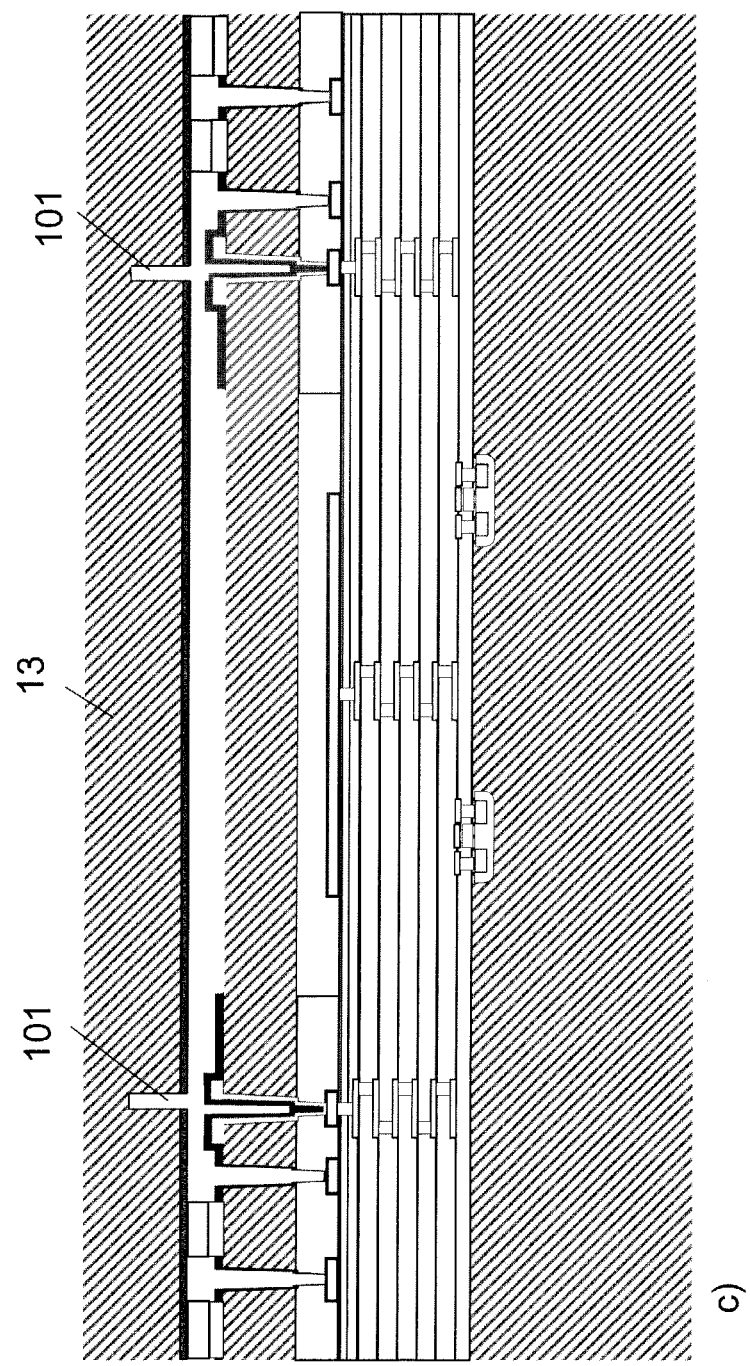

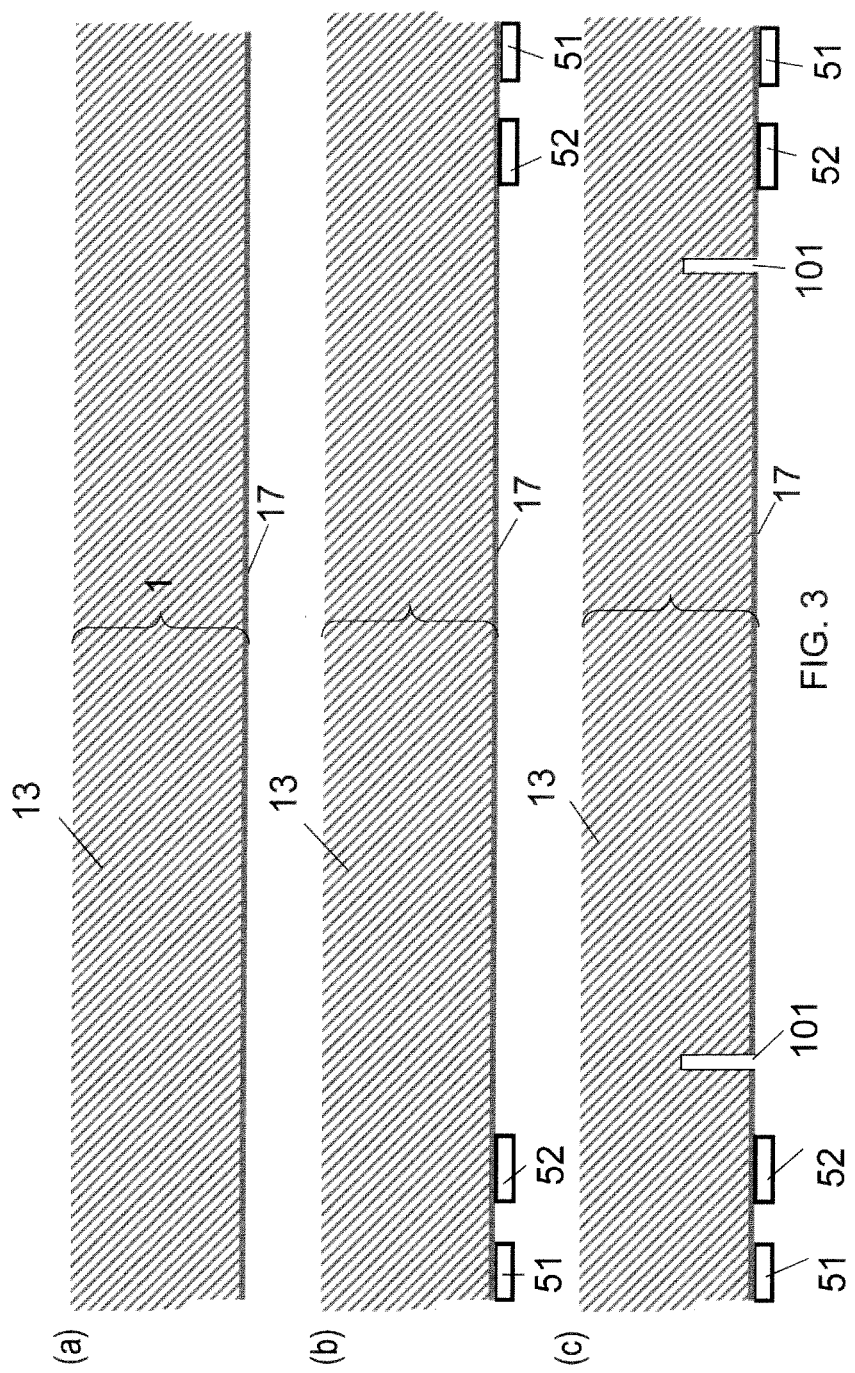

PRESSURE SENSOR WITH DEFORMABLE MEMBRANE AND METHOD OF MANUFACTURE

CROSS REFERENCES TO RELATED APPLICATIONS

This application claims the priority of European patent application 13005236.8, filed Nov. 6, 2013, the disclosure of which is incorporated herein by reference in its entirety.

FIELD OF THE INVENTION

The present invention relates to a pressure sensor and a method for manufacturing a pressure sensor.

BACKGROUND OF THE INVENTION

Pressure sensors and methods of manufacturing pressure sensors are known. In the U.S. Pat. No. 7,704,774 B2 for example, there is described a pressure sensor, which is manufactured by joining two substrates, the first substrate comprising CMOS circuitry and the second being an SOI substrate. A cavity is formed in a top material layer of the first substrate, which is covered by the silicon layer of the second substrate. Part or all of the substrate of the second wafer is removed to form a membrane from the silicon layer. Alternatively it is further described that the cavity can be formed in the second substrate. The second substrate is electrically connected to the circuitry on the first substrate. The known design allows for the use of standard CMOS processes for integrating circuitry on the first substrate.

In pressure sensors the membrane may be sensitive to stress. When a pressure sensor is mounted to a carrier and is electrically connected thereto mechanical stress may be evoked and transmitted via solder balls to the first substrate and specifically to stress sensitive structures of the pressure sensor such as the membrane.

SUMMARY OF THE INVENTION

Hence, according to a first aspect of the invention, there is provided a pressure sensor, particularly an absolute pressure sensor, with a deformable membrane providing a separation between a cavity with in the case of an absolute pressure sensor an essentially constant pressure and a port open to the outside of the sensor. The cavity is formed in a cap which cap is attached to a first substrate such that the deformable membrane faces the first substrate and such that a gap is provided between the deformable membrane and the first substrate. The cap further contains a processing circuit. A deformation of the deformable membrane is converted by suitable sensing means into a signal that is supplied to and processed by the processing circuit in the cap.

The first substrate contains a support portion to which the cap is attached. A contact portion of the first substrate is provided for electrically connecting the pressure sensor to the outside world. The support portion is suspended from the contact portion by one or more suspension elements.

In this arrangement, the deformable membrane as element sensitive to stress in essence is mechanically decoupled from the contact portion of the first substrate via which stress may be induced from an external carrier, or during mounting of the pressure sensor to an external carrier given that the contact portion preferably is the only portion via which the pressure sensor is electrically and mechanically connected to e.g. an external carrier which may an example of an external device. Not only is the deformable membrane no longer attached to the first substrate and is integrated into the cap instead. Moreover, already a first substrate portion, i.e. the support portion is mechanically decoupled from the contact portion. On the other hand, the cap is attached, and preferably is solely attached to the support portion of the first substrate but not to the contact portion such that the membrane has no direct mechanical link to the contact portion of the first substrate. Hence, any propagation of stress induced via the contact portion of the first substrate towards the membrane is significantly reduced.

The cap is arranged such that the deformable membrane faces the first substrate, and preferably faces a front side of the first substrate. A gap is provided between the deformable membrane and the front side of the first substrate in order to allow a deflection of the membrane in a direction orthogonal to the plane of the cap. In such arrangement, the deformable membrane is protected given that it does not directly face the environment of the sensor.

In a preferred embodiment, the cap is at least partly manufactured from a second substrate. Preferably, the second substrate is a semiconductor substrate, such as a silicon substrate. Hence, the second substrate may, for example, contain a bulk material made from silicon and various layers stacked on the bulk material such as one or more of metal layers, insulation layers and passivation layers. It is preferred, that the processing circuit is integrated into the second substrate. And it is preferred that the cavity is formed solely in the layer stack of the second substrate and does not reach into the bulk material.

In a preferred embodiment, the deformable membrane is built from a third substrate, which is attached to the top layer of the second substrate. The third substrate may, for example, be an SOI (Silicon On Insulator) substrate, wherein specifically the deformable membrane may be built from a silicon layer of the SOI substrate while an insulation layer and bulk material of the SOI substrate are removed during processing.

In the first substrate, the contact and the support portion are preferably built by applying one or more grooves vertically through the first substrate. By way of manufacturing the one or more grooves, one or more small portions of the first substrate remain for mechanically linking the support portion to the contact portion. This/these small portion/s act as suspension element/s for suspending the support portion from the contact portion. Preferably, the one or more grooves are arranged vertically in the first substrate, i.e. orthogonal to a plane extension of the first substrate. The suspension element/s may contain ridges, e.g. four ridges that hold the support portion. Preferably, each suspension element is formed integrally with the support portion and the contact portion given that in a preferred embodiment the support portion, the contact portion and the one or more suspension elements are built from the first substrate. In a preferred embodiment, the suspension elements do not represent the shortest path between the contact portion and the support portion but do have a shape that allows one or more of a deflection or a rotation of the support portion relative to the contact portion, e.g. a deflection in at least one direction of the plane of the first substrate. In such way, translational and/or rotational forces applied to the support portion via the cap may be dampened without damaging the suspension elements. The suspension elements may contain spring portions for this purpose.

The one or more suspension elements preferably act as components of reduced stiffness for reducing stress that otherwise migrates to the cap. The one or more grooves to a large extent decouple the cap from the contact portion of the first substrate and preferably surround the contact portion except for the one or more suspension elements. Summarizing, the stress sensitive deformable membrane is mechanically decoupled from the contact portion of the first substrate which is the component accepting stress when being mounted to a carrier.

The sensing means may in one embodiment contain the deformable membrane itself serving as first electrode and as such containing electrically conducting material. On the other hand, a second electrode may be arranged near or in the cavity at a stationary position such that this electrode arrangement may allow sensing a capacitance between the second electrode and the deflectable membrane which capacitance is dependent on the distance between the electrodes. For example, in case a medium such as a gas is applied to the cavity at a defined pressure and a deflection of the membrane is evoked, a distance between the electrodes may change and result in a change of the capacitance. In one embodiment, the second electrode may be a metal layer, or in another embodiment, may be a polysilicon layer.

In a preferred embodiment, the electrodes are electrically connected to the processing circuit integrated in the second substrate.

For electrically connecting the cap to the first substrate, electrical connections may be provided between the cap and the first substrate, e.g. in form of solder bumps or balls, or other electrically conducting elements that at the same time may also serve as spacer elements for providing the gap between the first substrate and the deformable membrane. In order to connect to the electrically conducting layers in the second substrate, contact windows may be provided into the second substrate and if applicable through the third substrate. On the other hand, the spacer elements may connect to contact pads on the first substrate which may be areas of conducting layers revealed from the first substrate.

According to another aspect of the present invention which aspect is independent from the embodiments relating to a pressure sensor, a sensor is provided comprising a first substrate, a cap attached to the first substrate wherein the cap includes a processing circuit and a sensitive element for converting a measure to be sensed into a signal capable of being processed by the processing circuit.

The first substrate comprises a support portion the cap is attached to, a contact portion for electrically connecting the sensor to an external device, and one or more suspension elements for suspending the support portion from the contact portion.

In a preferred embodiment, the cap is attached to the first substrate such that the sensitive element faces the first substrate and such that a gap is provided between the sensitive element and the first substrate.

According to another aspect of the present invention, a method is provided for manufacturing a pressure sensor. A first substrate is provided, as well as a second substrate and a third substrate. In the second substrate, a processing circuit is integrated and a cavity is manufactured, e.g. by etching. In another embodiment, the second substrate may be prefabricated with the processing circuit and/or the cavity. In the following, the third substrate is mounted to the second substrate thereby covering the cavity in the second substrate to build a deformable membrane for sensing a pressure applied thereto.

In the following, an assembly of the second substrate and the third substrate is mounted to a support portion of the first substrate with the deformable membrane facing the first substrate. Spacer elements may be provided for mounting the deformable membrane distant from a surface of the first substrate in order to provide a gap between the deformable membrane and the first substrate.

One or more grooves are manufactured into the first substrate around a contact portion which serves for electrically connecting the pressure sensor to an external device. As a result of manufacturing the one or more grooves, the support portion suspends from the contact portion by means of suspension elements.

The manufacturing of the one or more grooves may be performed in different ways: The first substrate preferably is preprocessed prior to being attached to the assembly of the second and the third substrate by etching trenches from e.g. a front side of the first substrate therein. It is assumed that the first substrate is thin enough and an etching process is applied that allows etching trenches in the first substrate that reach through the first substrate.

In an alternate embodiment, the trenches may not be manufactured at a sufficient depth for reaching through the entire bulk material of the first substrate. Hence, there may be another processing step required to open the trenches from the backside of the first substrate, i.e. opposite to the front side that faces the deformable membrane. In this embodiment, it is preferred that the trenches are manufactured prior to assembling the first substrate and the assembly of the second and third substrate while the trenches are laid open from the backside of the first substrate after having attached the assembly to the first substrate.

In a preferred embodiment, the bulk material of the first substrate is first thinned all across the first substrate in order to enable an etching through the entire first substrate in one go, or to facilitate an opening of previously etched trenches from the backside.

In the first substrate, electrically conducting vias may be built for electrically connecting the cap and specifically its processing circuit to electrical contacts at the backside of the first substrate. It may be preferred that the vias are built in the first substrate after having mounted the assembly of the second substrate and the third substrate to the first substrate and prior to opening the trenches in the first substrate if required. In a preferred variant of the invention, the one or more vias are made using a TSV (Through Silicon Via) process. Prior to e.g. etching the holes for the vias into the first substrate, a thickness of the first substrate may be reduced, e.g. down to 150 μm (micron) or less rendering it more suitable for TSV or similar processes. When reducing the thickness of the first substrate the second substrate may protect the deformable membrane and other sensitive structures.

In case the second substrate contains a bulk material such as silicon and layers stacked onto the bulk material, it is preferred that the cavity only extends into one or more of the layers but not into the bulk material.

In a preferred step, the third substrate includes an SOI (Silicon On Insulator) substrate. The third substrate preferably is attached to a top layer of the second substrate. Then, bulk material of the SOI substrate and its insulating layer preferably are removed thereby leaving a silicon layer as deformable membrane spanning the cavity in the second substrate.

Preferably, in a step following the previous step of applying the third substrate to the second substrate, one or more contact windows are etched through the third substrate outside the area of the deformable membrane, and preferably are etched into at least some of the layers of the second substrate in order to provide access to electrically conducting layers therein. These electrically conducting layers in turn may be connected to the electrodes one the one hand, and to the processing circuit on the other hand. The contact windows preferably are metalized in a next step.

A total height of the pressure sensor stack may preferably be between 350 to 500 microns.

It is preferred that the processing circuit is fabricated in the second substrate by a CMOS process following well-known steps.

In a very preferred embodiment, the method is executed on a wafer scale, i.e. multiple pressure sensors are manufactured in the same manufacturing steps on the same wafer. At one point in time, e.g. at the very end, the individual pressure sensors are separated from each other by dicing the wafer stack. Prior to the separation step, a second wafer is provided with multiple processing circuits being preprocessed thereon, as well as a first and a third wafer corresponding to the first and third substrate. The processing circuits and the cavities and are manufactured in the second wafer, and the second wafer prepared in this manner is attached to the third wafer for processing the deformable membranes. The assembly of the second and the third wafer may then be mounted to the first wafer with the deformable membranes facing the first wafer. The first wafer may be preprocessed with trenches reaching into or through the first wafer. Returning to the assembled first, second and third wafers, the first wafer may then continued to be processed from its backside, e.g. by manufacturing vias. It is preferred that, if the trenches prepared in the first substrate do not reach through it, the laying open of the trenches is performed from the backside of the substrate after having manufactured the vias, however, still on wafer-scale. At the very end, the wafer stack may be separated into individual pressure sensor chips.

According to another aspect of the present invention which aspect is independent from the embodiments relating to the manufacturing of a pressure sensor, a method for manufacturing a sensor is provided, comprising the steps of providing a first substrate, providing a second substrate and mounting the second substrate to a support portion of the first substrate. Grooves are manufactured into the first substrate around a contact portion for electrically connecting the pressure sensor to an external device, thereby making the support portion suspend from the contact portion by means of suspension elements.

In a preferred embodiment, a sensitive element is arranged at the second substrate with the sensitive element facing the first substrate. A gap may be provided between the sensitive element and the first substrate.

The described embodiments similarly pertain to the sensor and the method. Synergetic effects may arise from different combinations of the embodiments although they might not be described in detail.

While it is preferred that the order of method steps is as listed in the claims, a different order shall be encompassed by the subject method claims, too, where technically applicable.

Other advantageous embodiments are listed in the dependent claims as well as in the description below.

BRIEF DESCRIPTION OF THE DRAWINGS

Embodiments of the present invention, aspects and advantages will become apparent from the following detailed description thereof. Such description makes reference to the annexed drawings, wherein the figures show:

FIG. 3 in its diagrams a) to c) schematic cross-sections of a preprocessing of a first substrate for a pressure sensor according an embodiment of the present invention.

DETAILED DESCRIPTION

Figure 1:
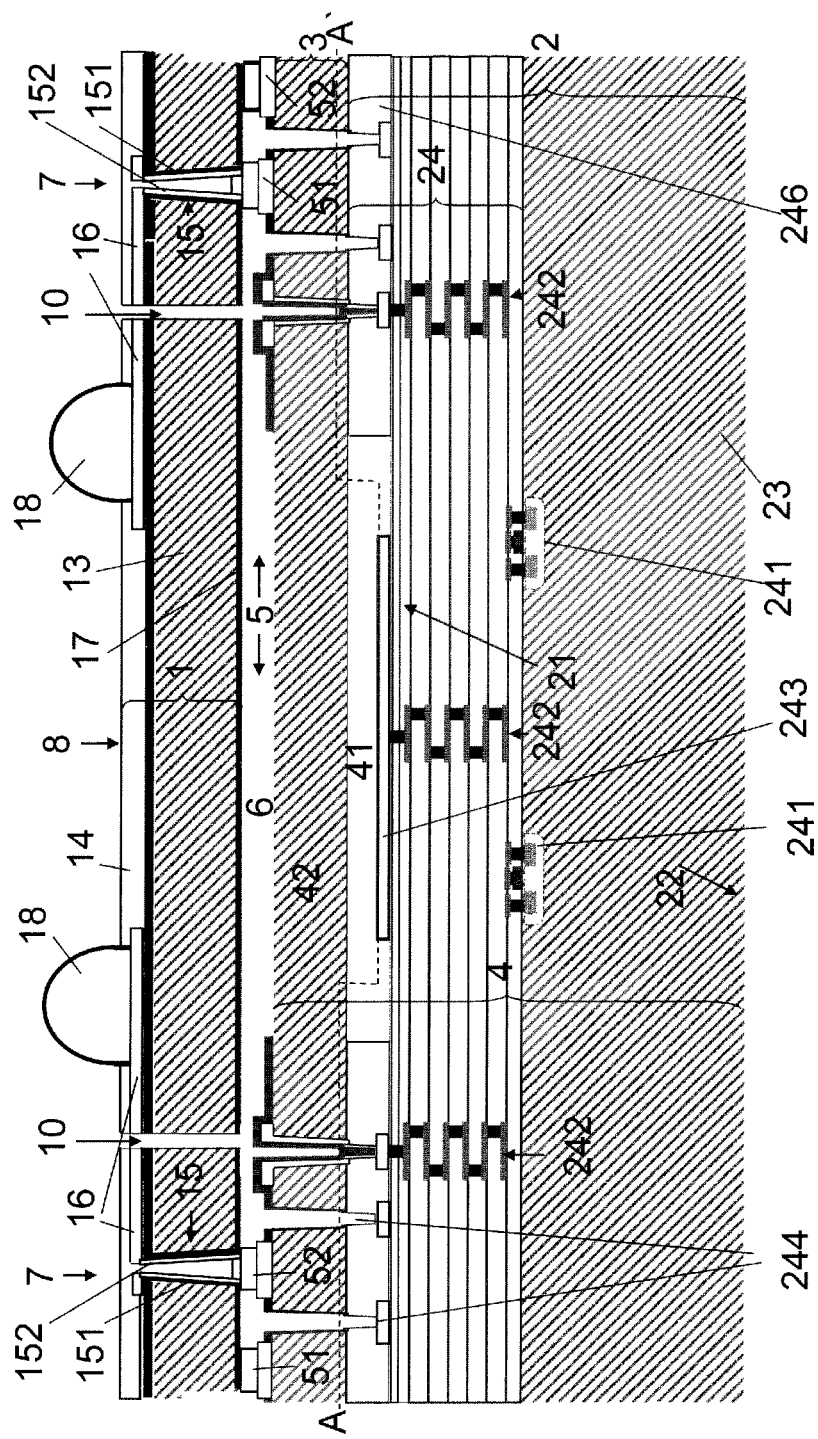
FIG. 1 in a) a schematic sectional view, in b) a representative horizontal cut, and in c) a representative bottom view of a pressure sensor in accordance with an example of the invention.
Figure 1:
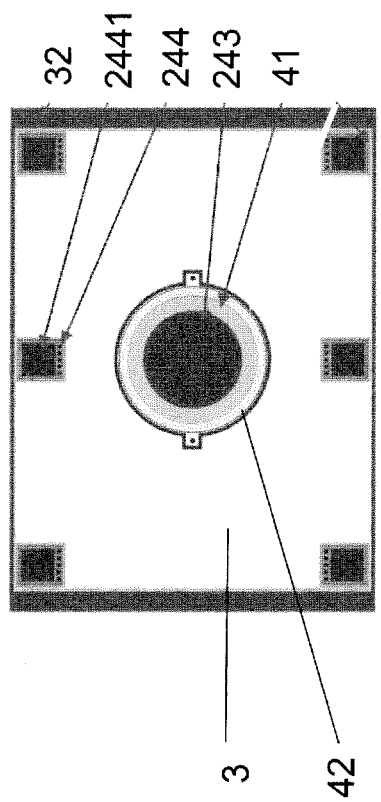
Figure 1:
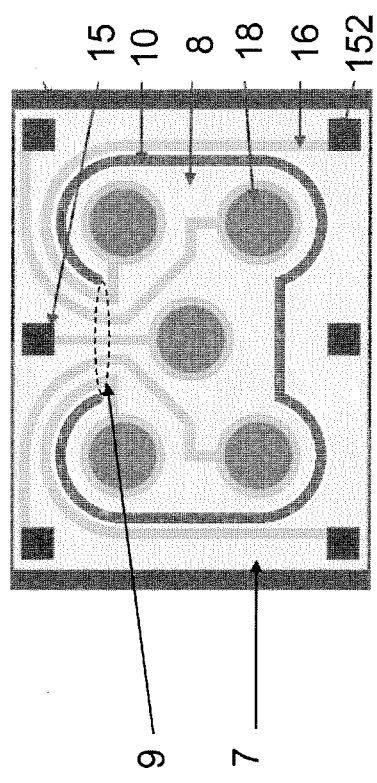

The term "pressure sensor" as used herein designates any type of sensor measuring a parameter that is equal to or derived from the pressure of a fluid. In particular, the term designates relative (i.e. differential) as well as absolute pressure sensors, it also covers static as well as dynamic pressure sensors. Typical examples of applications of such sensors are e.g. in scientific instrumentation, meteorology, altitude measurement, sound recording, mobile or portable computers and phones etc.

FIG. 1a) shows a schematic sectional view of a pressure sensor in accordance with an embodiment of the present invention. The pressure sensor as shown is flipped with its solder balls 18 showing upwards while the pressure sensor will be mounted to a carrier with its solder balls sitting on the carrier.

The pressure sensor includes a first substrate 1 and a cap 4 for the first substrate 1.

The cap 4 preferably is made from a second substrate 2 and a third substrate 3. The second substrate 2 preferably is a semiconductor substrate, preferably a silicon substrate, and has a front side 21 and a backside 22. The second substrate 2 contains a bulk material 23 of, e.g. silicon and a stack of layers 24 on the bulk material 23. These layers 24 may be arranged for CMOS processing of the second substrate 2, and as such may also be denoted as CMOS layers or material layers. Specifically, the layers 24 can include for example a plurality of SiO2 layers, metal or polysilicon layers. The bulk material 23 may contain doped regions within the silicon such as indicated by the reference sign 241. These components can form active circuitry, such as amplifiers, A/D converters or other analog and/or digital signal processing units. A top layer 246 of the stack of layers 24 may be a dielectric layer of silicon oxide and/or silicon nitride protecting the structures below it. In the present example, it is assumed that a processing circuit collectively referred to as 241 is integrated on the front side 21 of the second substrate 2 by means of CMOS processing.

In the cap 4, a cavity 41 is formed by omitting or removing material from one or more of the layers 24, presently the top layer 246. The cavity 41 is closed by a deformable membrane 42. The membrane 42 is sufficiently thin such that it deforms depending on a pressure drop between a pressure at the top of the membrane 42 and below it. A metal layer 243 may be used as an electrode, and as such may be arranged at the bottom of the cavity 41.

The membrane 42 preferably is formed by a doped, conducting silicon layer, is arranged as a sealing lid over the cavity 41, and may be used as another electrode for which reason the deformable membrane 42 may contain electrically conducting material. Hence upon a change in pressure the membrane 42 deflects and as such a distance between the two electrodes changes which results in a change of the capacitance between the two electrodes.

In the present example, the deformable membrane 42 is built from a third substrate 3. The third substrate 3 as shown in FIG. 1 may be the remainder of an SOI substrate, specifically its device layer after some manufacturing steps. The third substrate 3 not only may contribute to the deformable membrane 42. The third substrate 3 may contain contact windows 244 reaching through which may also reach into one or more of the layers 24.

Corresponding signals may be transmitted from the electrodes, i.e. the deformable membrane 42 and the metal layer 243 via electrical paths 242 to the processing circuit 241 where these signals are processed. Signals processed by the processing circuit 241 may be supplied to the first substrate 1.

The first substrate 1 may be a semiconductor substrate, e.g. a silicon substrate, or a glass substrate, for example, with a front side 11 and a back side 12. The semiconductor substrate 1 includes bulk material 13 such as silicon, and one or more layers 14, such as an oxide layer on the bulk material 13. The one or more layers 14 may further include for example a plurality of SiO2 layers, metal or polysilicon layers.

The first substrate 1 contains vias 15 reaching vertically through the first substrate 1. Those vias 15 provide for an electrical connection from the front side 11 of the substrate 1 to its backside 12. Those vias 15 are manufactured by etching or drilling holes into the first substrate 1 from its backside 12, by applying an oxide 151 to the hole, and by applying conducting material 152 to the oxide 151. At the back side 12 of the first substrate 1, the vias 15 are electrically connected to contact pads 16 residing on an oxide layer 17 applied to the bulk material 13, which contact pads 16 serve as support for solder balls 18 or other contact means for electrically connecting the pressure sensor to the outside world, i.e. to another device. Alternative to the vias 15 and the solder balls 18, there may be other ways of interconnecting the pressure sensor to the outside world, e.g. by means of wire bonds, bond pads or conducting structures that lead from the front side 11 of the first substrate 1 along its sides to the backside 12. The electrical connection to the outside world may also be implemented via one or more of a Land Grid Array, a Pin Grid Array, or a leadframe.

The assembly containing the second and the third substrate 2,3 is attached to the front side 11 of the first substrate 1. The attachment may include bonding or other fusion techniques. In the present example, spacer elements 5 are provided between the third substrate 3 and the first substrate 1. The spacer elements 5 may have different functions: On the one hand, the spacer elements 5 provide for a gap 6 between the deformable membrane 42 and the first substrate 1 which is required for supplying the pressure medium to the membrane 42. On the other hand, some of the spacer elements 5, but not necessarily all may be electrically conductive for connecting the contact windows 244 to the first substrate 1. Other or the same spacer elements 5 may provide mechanical stability for the stacking of substrates 1,3, and/or may provide mechanical protection to the inside of the pressure sensor, and specifically to the membrane 42. For this purpose, it may be preferred, that a spacer element 51 is arranged in from of a ring at the edges of the substrates 1,3 providing mechanical stability, protection as well as an electrical connection, while spacer elements 52 are rather pillar-like and provide electrical connections.

The signals provided by the processing circuit 241 hence may be transferred via one or more of the electrical paths 242 and via one or more of the contact windows 244 to one or more of the spacer elements 5. As shown in FIG. 1, the spacer elements 52 end at the vias 15 of the first substrate 1 and are electrically connected thereto. Hence, the signals are conducted through the vias 15 to the contact pads 16 and the solder balls 18.

The first substrate 1 contains a support portion 7 and a contact portion 8. Suspension elements not shown in the present illustration are provided for suspending the support portion 7 from the contact portion 8. The support portion 7 preferably encircles the contact portion 8 in a plane of the first substrate 1.

The contact portion 8 is separated from the support portion 7 by one or more grooves 10. Owed to the manufacturing of the contact portion 8 and the support portion 7 from the common first substrate 1, both portions may include bulk material 13 from the first substrate 1.

The cap 4 preferably is exclusively attached to the support portion 7 of the first substrate 1 via the spacer elements 5. On the other hand, it is preferred that it is solely the contact portion that provides a mechanical and electrical contact to the outside world. Hence, the portion of the pressure sensor via which mechanical stress is induced, i.e. the contact portion 8 is mechanically decoupled from the rest of the pressure sensor and specifically from the deformable membrane 42 by way of the suspension elements.

A port for conducting a medium to the deformable membrane 42 in the present example encompasses the the grooves 10 and the gap 6, or at least parts of.

The overall height of the pressure sensor in the present example is about 400 μm.

FIG. 1b) illustrates a representative horizontal cut of a pressure sensor, e.g. according to line A-A' in FIG. 1a) not necessarily matching all elements as provided in FIG. 1a). A mechanical support 32 holds the third substrate 3. In the third substrate 3, a plurality of contact windows 244 are provided which contain electrically conducting material 2441 in their interior. The third substrate 3 also builds the deformable membrane 42. Then, the horizontal cut switches to a different plane, i.e. the plane of the electrode 243. This electrode 243 is surrounded by the cavity 41.

FIG. 1c) illustrates a bottom view onto the first substrate 1 of the pressure sensor. The first substrate 1 contains a support portion 7 and a contact portion 8 wherein the support portion 7 is suspended from the contact portion 8 by means of a suspension element 9, which is a representation of a mechanical link between the two portions 7 and 8. A groove 10 is arranged vertically through the first substrate 1. Vias 15 are arranged in the support portion 7, while the solder balls 18 are arranged in the contact portion 8. The contact portion 8 is electrically connected to the support portion 7 by means of electrically conducting structures such as the contact pads 16 which electrically conducting structures may in generally be denoted as redistribution layer.

Figure 2:
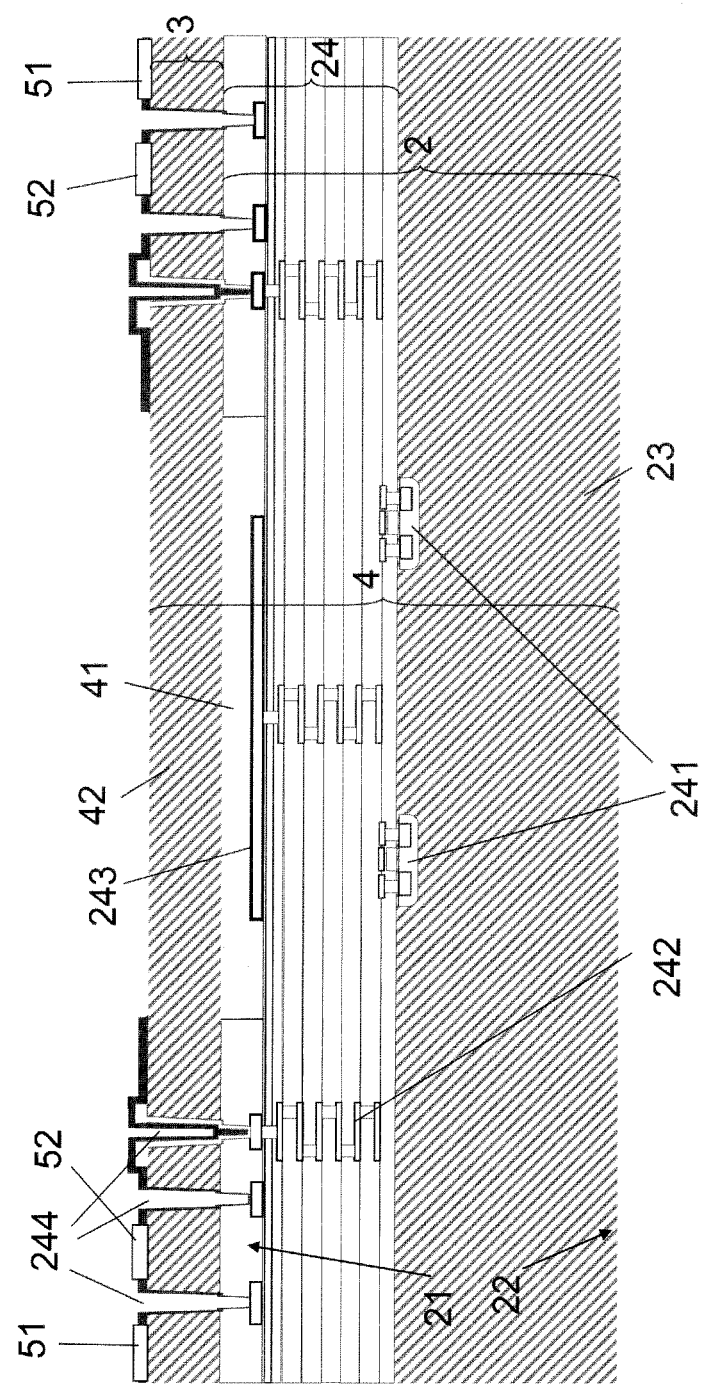
FIG. 2 in its diagrams a) to d) schematic cross-sections of a pressure sensor according an embodiment of the present invention during processing thereby illustrating processing steps of a method according an embodiment of the present invention.
Figure 2:
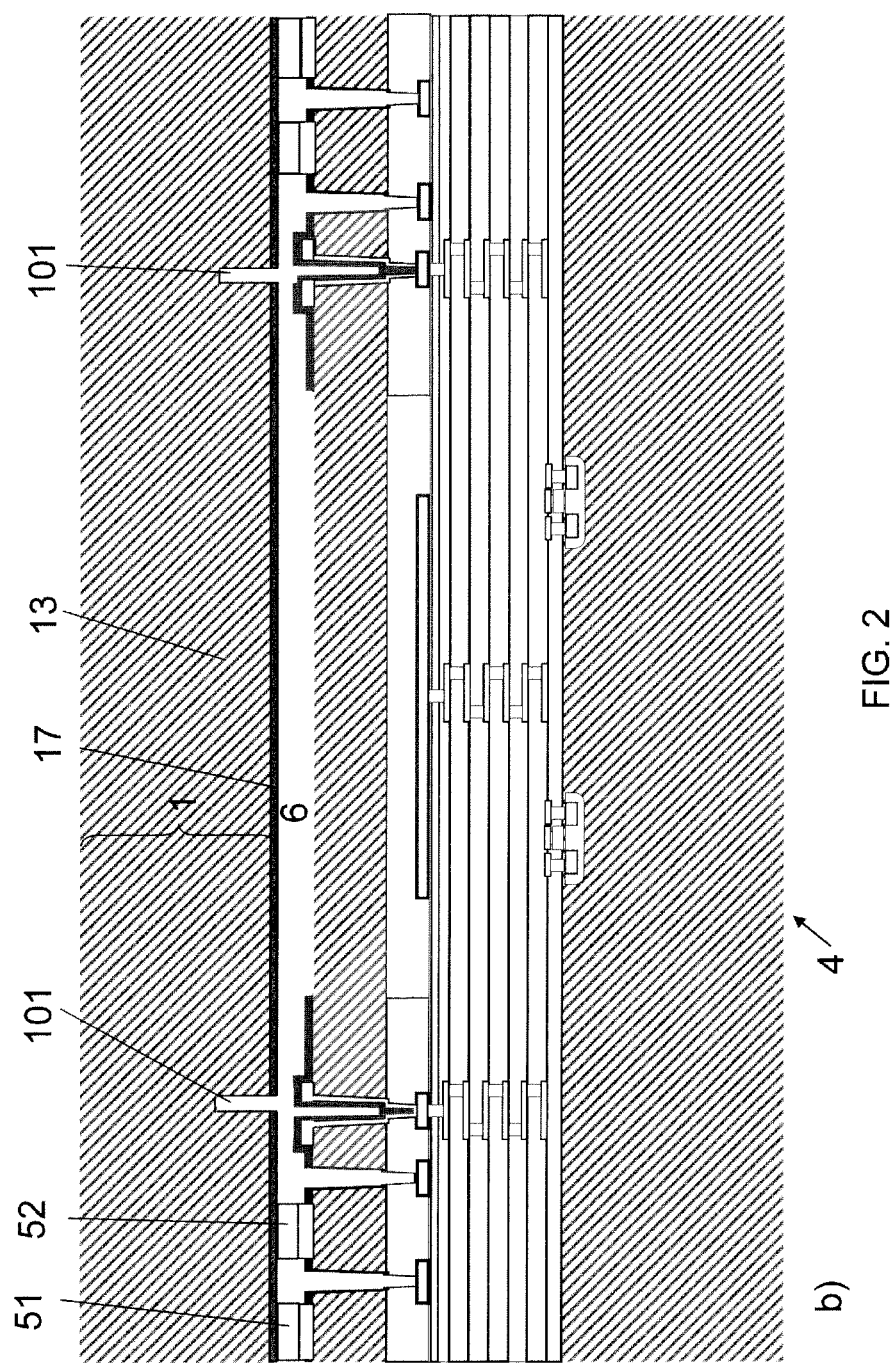
Figure 2:
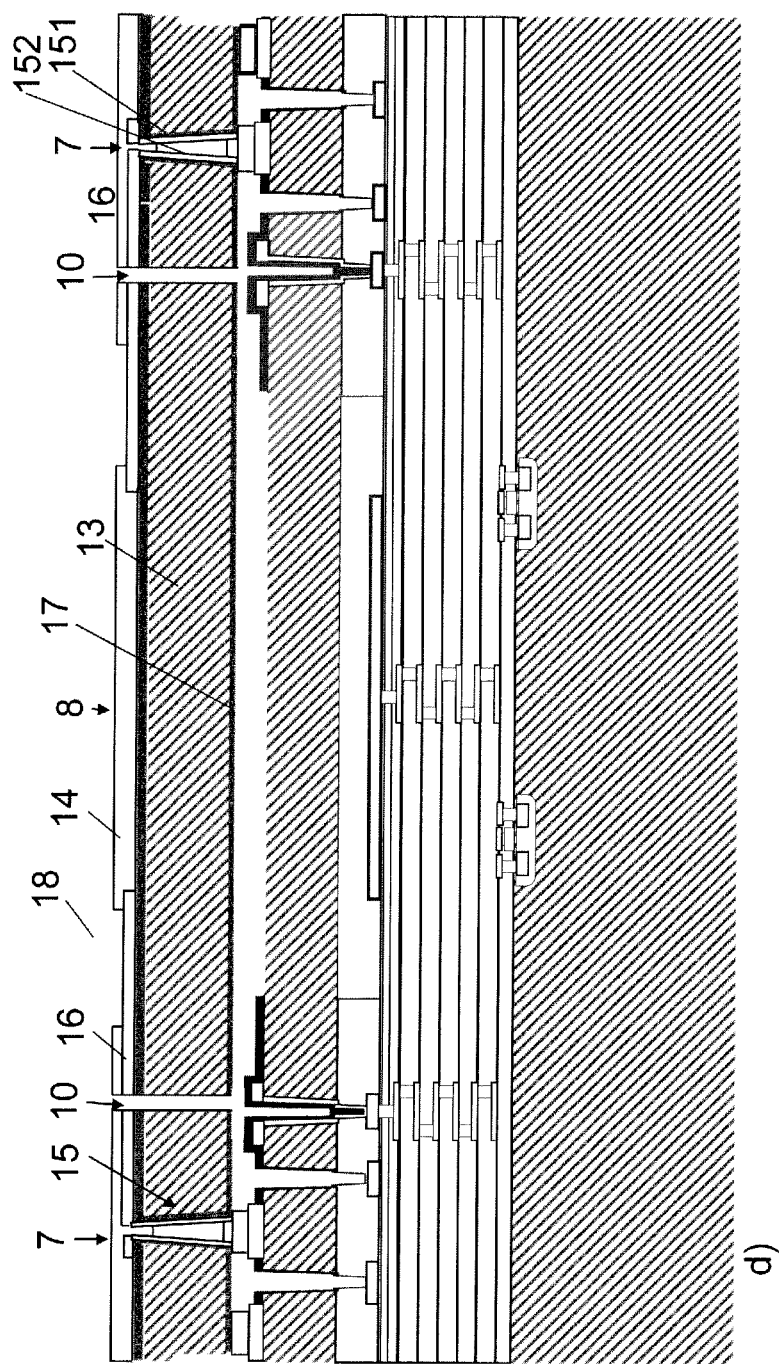

FIG. 2 shows in its diagrams a) to d) schematic cross-sections of a pressure sensor according an embodiment of the present invention during manufacturing thereby illustrating the individual processing steps. In FIG. 2a) a pre-processed second substrate 2 is shown with a front side 21 and a back side 22 including a bulk material 23 and layers 24 stacked on the bulk material 23, which layers 24 are only schematically illustrated and may contain oxide layers, e.g. SiO2, metal layers, and/or polysilicon layers such as layer 243 serving as electrode, and a top layer 246 serving as passivation layer. A processing circuit 241 is integrated into the second substrate 2, e.g. by doping the bulk material 23 and/or by structuring the layer stack 24. In addition, a cavity 41 is etched into the layers 24, and preferably into the top layer 246.

In a next step, the deformable membrane 42 is built on the preprocessed substrate 2. For this purpose, a third substrate 3 in form of an SOI substrate is attached to the layers 24 of the second substrate 2 at its front side 21 e.g. by fusion bonding. The SOI substrate may contain bulk material, an insulation layer in form of a BOX layer, and a silicon layer as device layer. As a result, the cavity 41 is closed. In a further step not explicitly shown in the Figures, the bulk material and the insulation layer of the SOI substrate are removed such that the silicon layer remains as third substrate 3 covering the cavity 41, which silicon layer is thin enough to deflect in response to pressure applied.

In a next step, contact windows 244 are etched through the third substrate 3 into the layers 24 of the second substrate 2. The contact windows 244 are metalized and spacer elements 51 and 52 are applied to the third substrate 3.

In a next step illustrated in FIG. 2b), a preprocessed first substrate 1 is attached to the assembly of the second and the third substrate 2, 3. The first substrate 1 is preprocessed, for example, according to the diagrams of FIG. 3.

In the diagram of FIG. 3a) a first substrate 1 is provided, e.g. a semiconductor substrate such as a silicon substrate. At its top side, one or more layers 14 are arranged, such as CMOS layers, or simply an isolation layer such as a silicon-oxide layer. In an additional step shown in FIG. 3b), spacer elements 51 and 52 are arranged at the front side 11 of the first substrate 1. In the step shown in FIG. 3c), trenches 101 are etched into the bulk material 13 of the first substrate thereby penetrating the layers 14, e.g. by deep reactive ion etching.

The first substrate 1 preprocessed according to FIG. 3c) then is applied to the assembly of the preprocessed second and third substrate 2, 3 according to FIG. 2a) thereby resulting in an assembly according to FIG. 2b).

In a next step as illustrated in FIG. 2c), the first substrate 1 is thinned from its backside 11 to a reduced thickness in the range of e.g. 100 to 200 microns. This process can be performed using grinding, etching or milling.

In the step illustrated in FIG. 2d), the first substrate 1 is continued to be processed: Vias 15 are manufactured through the first substrate 1. Preferably in a step following the manufacturing of the vias 15, the trenches 101 in the first substrate 1 are opened from the backside 12 of the first substrate 1, e.g. by way of etching such that one or more grooves 10 are now provided reaching through the first substrate 1. In a last step, solder balls 18 or other contact structures may be attacked to the backside 12 of the first substrate 1. The result is shown in FIG. 1.

By having manufactured the one or more grooves 10, the first substrate 1 is separated into a support portion 7 to which the cap 4 is attached, and a contact portion 8 via which the pressure sensor is electrically connected to another device.

It should be noted, that the present invention is not limited to embodiments where the sensing element is a capacitive sensor as described. Rather, it can be used with any type of pressure sensors that uses a deformable membrane in order to measure a quantity dependent on the pressure drop over the same. In particular, the invention can also be used for sensors where the deformation of the membrane is measured by piezoresistive means.

It should further be noted that in any removal of material during manufacturing, the corresponding structures may be created using a chemical (wet) etching process, plasma etching process, laser cutting, mechanical milling or a combination of any of these processes, where suitable.

While above there are shown and described embodiments of the invention, it is to be understood that the invention is not limited thereto but may be otherwise variously embodied and practiced within the scope of the following claims.

The invention claimed is:

1. A pressure sensor, comprising
a first substrate,
a cap attached to the first substrate wherein the cap includes a processing circuit, a cavity and a deformable membrane separating the cavity and a port open to an outside of the pressure sensor, and
sensing means for sensing a deformation of the deformable membrane in response to pressure at the port, converting the sensed deformation into a signal and supplying said signal to the processing circuit for processing by the processing circuit,
wherein the cap is attached to the first substrate such that the deformable membrane faces the first substrate and such that a gap is provided between the deformable membrane and the first substrate which gap contributes to the port,
wherein the first substrate comprises a support portion the cap is attached to, a contact portion for electrically connecting the pressure sensor to an external device, and one or more suspension elements for suspending the support portion from the contact portion.

2. The sensor of claim 1,
wherein the first substrate has a plane extension and wherein the support portion encircles the contact portion in the plane of the first substrate,
wherein the support portion is separated from the contact portion except for the one or more suspension elements by one or more grooves in the first substrate.

3. The sensor of claim 1,
wherein each suspension element contains a ridge between the support portion and the contact portion, and
wherein one or more of the suspension elements includes at least one electrically conducting path for electrically connecting the support portion to the contact portion.

4. The sensor of claim 1,
wherein the first substrate has a front side facing the deformable membrane, a backside containing electrical contacts for electrically connecting the pressure sensor to the external device, and vias for electrically connecting the front side of the first substrate to its backside.

5. The sensor of claim 4,
wherein the electrical contacts are arranged in the contact portion,
wherein the vias are arranged in the support portion, and
wherein the vias are electrically connected to the contact portion through one or more of the suspension elements.

6. The sensor of claim 1,
wherein the cap contains a second substrate containing a bulk material and layers stacked on the bulk material,
wherein the cavity is a recess exclusively arranged in one or more of the layers of the second substrate,
wherein the processing circuit is integrated in the second substrate, and
wherein the deformable membrane is made from a third substrate attached to the layers of the second substrate.

7. The sensor of claim 6,
wherein the sensing means contains a first electrode formed by the deformable membrane and a second electrode formed by one of the layers of the second substrate,
wherein the first electrode and the second electrode are connected to the processing circuit.

8. The sensor of claim 7,
comprising spacer elements between the first substrate and the third or the second substrate for building the gap, and
wherein at least some of the spacer elements are used as electrical connections between the cap and the first substrate.

9. A method for manufacturing a pressure sensor, comprising the steps of
providing a first substrate,
providing a second substrate,
providing a third substrate,
manufacturing a cavity in the second substrate,
mounting the third substrate to the second substrate thereby covering the cavity in the second substrate to form a deformable membrane for sensing a pressure applied to the deformable membrane,
mounting the assembly of the second substrate and the third substrate to a support portion of the first substrate with the deformable membrane facing the first substrate and providing a gap between the deformable membrane and the first substrate, and
manufacturing grooves into the first substrate around a contact portion for electrically connecting the pressure sensor to an external device, thereby making the support portion suspend from the contact portion by suspension elements.

10. The method of claim 9,
wherein manufacturing the cavity in the second substrate includes manufacturing the cavity in one or more layers stacked on a bulk material of the second substrate, and
wherein mounting the third substrate to the second substrate to form the deformable membrane includes attaching a silicon-on-insulator substrate to a top layer of the second substrate, removing a bulk material and an insulating layer of the silicon-on-insulator substrate thereby leaving a silicon layer as deformable membrane spanning the cavity in the second substrate.

11. The method of claim 9,
wherein manufacturing the grooves into the first substrate includes manufacturing trenches reaching at least partly into the first substrate prior to attaching the assembly to the first substrate.

12. The method of claim 11,
wherein the trenches are manufactured by etching.

13. The method of claim 11,
wherein the trenches that reach partially into the first substrate are manufactured from its front side prior to attaching the assembly to the first substrate, and
wherein the trenches in the first substrate are laid open from its backside after having attached the assembly of the second substrate and the third substrate to the first substrate.

14. The method of claim 9,
wherein electrically conducting vias are built through the first substrate for electrically connecting the processing circuit to electrical contacts arranged on a backside of the first substrate opposite a front side facing the deformable membrane.

15. The method of claim 14,
wherein the vias are built after having mounted the assembly of the second substrate and the third substrate to the first substrate.

16. The method of claim 9,
wherein mounting the third substrate to the second substrate includes in a portion of the third substrate outside the deformable membrane
etching through the third substrate for manufacturing one or more contact windows in the second substrate, and
metalizing the one or more contact windows.

17. The method of claim 9,
wherein the gap between the first substrate and the assembly of the second and third substrate is manufactured by applying spacer elements between the first substrate and the assembly of the second and third substrate.

* * * * *